US008066057B2

(12) United States Patent  
Olesen

(10) Patent No.: US 8,066,057 B2
(45) Date of Patent: Nov. 29, 2011

(54) FLOW DISTRIBUTING UNIT AND COOLING UNIT

(75) Inventor: Klaus Kristen Olesen, Soenderborg (DK)

(73) Assignee: Danfoss Silicon Power GmbH, Schleswig (DE)

( * ) Notice: Subject to any disclaimer, the term of this patent is extended or adjusted under 35 U.S.C. 154(b) by 1358 days.

(21) Appl. No.: 10/577,140

(22) PCT Filed: Oct. 26, 2004

(86) PCT No.: PCT/DK2004/000735
§ 371 (c)(1),
(2), (4) Date: Apr. 25, 2006

(87) PCT Pub. No.: WO2005/040709
PCT Pub. Date: May 6, 2005

(65) Prior Publication Data
US 2007/0062673 A1 Mar. 22, 2007

(30) Foreign Application Priority Data
Oct. 27, 2003 (DK) .................................. 2003 01577

(51) Int. Cl.
*F28F 7/00* (2006.01)
*F28D 15/00* (2006.01)

(52) U.S. Cl. .................. 165/80.4; 165/80.5; 165/104.33; 361/699

(58) Field of Classification Search .................. 165/80.2, 165/80.4, 80.5, 104.33, 167; 361/699
See application file for complete search history.

(56) References Cited

U.S. PATENT DOCUMENTS

| 4,444,851 | A | 4/1984 | Maru ................................ 429/26 |
| 5,016,090 | A | 5/1991 | Galyon et al. .................... 357/82 |
| 5,666,269 | A * | 9/1997 | Romero et al. ................ 361/699 |
| 5,835,345 | A | 11/1998 | Staskus et al. ................ 361/699 |
| 5,841,634 | A * | 11/1998 | Visser ............................ 361/699 |
| 5,959,351 | A | 9/1999 | Sasaki et al. ................... 257/714 |
| 6,052,284 | A | 4/2000 | Suga et al. ...................... 361/699 |
| 6,101,715 | A | 8/2000 | Fuesser et al. ............... 29/890.03 |
| 6,131,649 | A * | 10/2000 | Pearl et al. ..................... 165/167 |
| 6,367,543 | B1 * | 4/2002 | Calaman et al. ............. 165/80.4 |
| 6,719,039 | B2 * | 4/2004 | Calaman et al. ............. 165/80.4 |
| 6,935,411 | B2 | 8/2005 | Valenzuela ................... 165/80.4 |
| 7,017,655 | B2 * | 3/2006 | Wilson et al. ................ 165/80.4 |
| 7,040,383 | B2 * | 5/2006 | Oyamada ................. 165/104.33 |
| 7,044,199 | B2 * | 5/2006 | Thayer et al. ................ 165/80.4 |
| 7,173,823 | B1 * | 2/2007 | Rinehart et al. ............. 361/699 |
| 7,243,706 | B2 * | 7/2007 | Coleman ..................... 165/80.4 |

(Continued)

FOREIGN PATENT DOCUMENTS

DE  202 08 106 U1  10/2002

(Continued)

*Primary Examiner* — Ljiljana Ciric
(74) *Attorney, Agent, or Firm* — McCormick, Paulding & Huber LLP

(57) ABSTRACT

A distributor (1) for distributing a flow of cooling fluid over one or more surface(s) (3) to be cooled has a housing (13) that may be manufactured in a single piece together with inlet (8) and outlet (9) manifolds and a plurality of flow cells (26, 27, 28, 29). The flow cells (26, 27, 28, 29) may be connected in parallel between the manifolds (8, 9), and may be adapted to cool multiple surfaces (3) simultaneously. The present invention is also directed to a fluid-coolable unit comprising a distributor (1) for removing heat from an electronic circuit, such as integrated circuit or CPU.

16 Claims, 8 Drawing Sheets

U.S. PATENT DOCUMENTS 7,690,419 B2 * 4/2010 Thayer et al. .................. 165/80.4

FOREIGN PATENT DOCUMENTS

| | | | |
|---|---|---|---|
| EP | 0 447 835 | A2 | 9/1991 |
| EP | 0 709 884 | A2 | 5/1996 |
| EP | 0 826 874 | A2 | 3/1998 |
| FR | 2 748 800 | | 11/1997 |
| FR | 2 774 462 | | 8/1999 |
| WO | 02/055942 | A2 | 7/2002 |

* cited by examiner

FLOW DISTRIBUTING UNIT AND COOLING UNIT

CROSS REFERENCE TO RELATED APPLICATIONS

This application is entitled to the benefit of and incorporates by reference essential subject matter disclosed in International Patent Application No. PCT/DK2004/000735 filed on Oct. 26, 2004 and Danish Patent Application No. PA 2003 01577 filed Oct. 27, 2003.

FIELD OF THE INVENTION

The present invention relates to a flow distributing unit which is suitable for a variety of cooling applications, and in particular for fluid cooling of power semiconductors. The invention also relates to a cooling unit employing such a flow distributing unit.

BACKGROUND OF THE INVENTION

Semiconductor devices generate heat during their operation, and this heat usually acts to degrade the operation of the semiconductor device. For power semiconductor devices it is necessary to be cooled during operation to maintain acceptable device performance, and for high power semiconductors liquid cooling is often applied.

U.S. Pat. No. 5,841,634 discloses a liquid-cooled semiconductor device. The semiconductors are here placed inside a housing on a plate which is to be cooled. The device shows a fluid inlet port and a fluid outlet port, and a baffle placed in a chamber inside the housing. The baffle includes a wall separating the chamber into a top portion and a bottom portion, and walls separating each portion into compartments. A number of holes in the wall between top and bottom portion provide fluid communication between the portions. Fluid is led from the inlet port to a first bottom compartment, and then through holes to a first top compartment. In the top compartment the fluid is led along the plate to be cooled, and through holes to a second bottom compartment. From the second bottom compartment the fluid is led to a second top compartment, where it cools another area of the plate to be cooled. After having passed three top compartments the fluid it led to the fluid outlet port, and out of the device. Thus the cooling compartments of the device are connected in a serial manner.

DE 202 08 106 U1 discloses a cooling device, in particular for liquid cooling of semiconductor devices. The cooling device comprises a housing and a separate baffle positioned inside the housing and with a plurality of flow cells defined therein. The flow cells each form a fluid connection between an inlet manifold and an outlet manifold. DE 202 08 106 U1 does not disclose that the housing, the manifolds and the flow cells are formed in a single piece.

U.S. Pat. No. 6,101,715 discloses a microcooling device with a channel structure through which a coolant fluid can flow. The device shown in FIG. 1 comprises an inlet manifold, an outlet manifold and a plurality of flow channels manufactured in a single piece.

The flow channels are connected in parallel between the manifolds along one direction, i.e. the direction transversal to the flow direction. However, they are not arranged in parallel along any other direction. As a consequence, a temperature gradient would inevitably occur along the flow direction of the flow channels, and it would not be possible to tailor the cooling.

EP 0 447 835 concerning a cold plate and an integrated cooling module embodying a cross-hatch flow distribution scheme discloses a prior art cooling module in FIG. 3. This prior art cooling module comprises an inlet and an outlet, and a meandering flow channel establishing a fluid connection between the inlet and the outlet. The flow channel is provided with fins in order to create turbulence in the cooling fluid. Since there is only one flow channel, the cooling is serial, and a temperature gradient will therefore occur.

As the fluid passes the first top compartment, it takes up heat from the plate to be cooled and thus leaves the first top compartment at a higher outlet temperature than the inlet temperature. When the fluid then reaches the second top compartment, additional heating of the fluid will take place, and this will lead to a temperature difference on the cooled plate, from fluid inlet port end to fluid outlet port end. This is detrimental to the lifetime of such a power semiconductor device as high power semiconductors are very sensitive to temperature variations and also sensitive to the general temperature level.

Also the serial connection of multiple cooling compartments will have a high flow resistance as a result, leading to a high pressure drop or a low flow rate of the fluid through the cooling device.

WO 02/055942 discloses a normal-flow heat exchanger comprising a core having a heat-transfer surface. An inlet plenum is located at one end of the length of the core, and an outlet plenum is located at the opposite end of the length. A plurality of inlet manifolds extend the length of the core, and a plurality of outlet manifolds extend the length of the core and are located alternatingly with the inlet manifolds across the width of the core. A plurality of interconnecting channels each fluidly communicate with a corresponding inlet manifold and the two outlet manifolds located immediately adjacent that inlet manifold. In order to provide the manifolds and the interconnecting channels, it is necessary to manufacture the heat exchanger in several plates which are subsequently assembled to form a unitary structure. In order to obtain a tight fit between the individual plates, it is necessary to manufacture each plate in a very precise manner. This is a disadvantage because it is very difficult and expensive to obtain sufficient accuracy. Consequently the unit price for the heat exchanger becomes relatively high.

BRIEF SUMMARY OF THE INVENTION

It is an object of the present invention to provide a flow distributing unit which is more cost effective to manufacture than prior art distributing units.

It is a further object of the present invention to provide a flow distributing unit having a design which makes it suitable for mass production.

It is an even further object of the present invention to provide a cooling unit which is cost effective to manufacture and which has a design which makes it suitable for mass production.

According to the present invention the above and other objects are fulfilled by providing a distributor for distributing a flow of fluid over at least one surface to be cooled, the distributor comprising a housing being manufactured in a single piece and having formed therein an inlet manifold, an outlet manifold and a plurality of flow cells connected between the manifolds, each flow cell comprising a cell inlet in fluid communication with the inlet manifold, a cell outlet in fluid communication with the outlet manifold, and a flow channel for guiding a flow of fluid from the cell inlet along the surface(s) to the cell outlet, wherein an inner wall structure of the housing defines the inlet manifold, the outlet manifold and the plurality of flow cells.

The distributor is adapted for distributing a flow of fluid over at least one surface to be cooled. Thus, it may be shaped in such a way that it can be positioned adjacent only one surface to be cooled. Alternatively, it may be shaped in such a way that it can be positioned adjacent two, three, four, or even more surfaces to be cooled. It should be understood that even though the distributor is shaped in such a way that it can be positioned adjacent two or more surfaces to be cooled, it may still be used for applications in which fewer surfaces, e.g. one surface, need to be cooled.

The housing is manufactured in a single piece. This is to be understood in such a way that at least the housing, the inlet manifold, the outlet manifold and the plurality of flow cells form one piece without requiring the assembly of two or more pieces of material. In other words, an inner wall structure of the housing defines at least the inlet manifold, the outlet manifold and the plurality of flow cells.

This is a great advantage since manufacturing the housing in a single piece makes it very easy and cost effective to manufacture the distributing unit because it is no longer necessary to manufacture and assemble several pieces in order to provide the housing, the manifolds and the flow cells. Apart from saving production steps, i.e. manufacturing each piece separately and assembling the various pieces, this makes it possible to mass produce the distributing unit, e.g. by means of injection moulding from e.g. a thermoplastic material or a metal. Alternatively, the housing may be manufactured as a part of an apparatus which needs to be cooled. Thus, it may e.g. be machined into a stator or housing (typically made of a metal, such as aluminium) of an electric motor which is adapted to be controlled by a frequency converter, which in turn comprises a power module which needs to be cooled. Thereby the cooling unit is provided directly as a part of the apparatus, thereby even further saving production steps.

Furthermore, the requirements to the manufacturing accuracy are considerably reduced since there are no longer a plurality of pieces which need to fit together. Thus, a distributing unit has been provided which is cost effective to manufacture, and which is suitable for mass production.

The inlet manifold is typically a part of the distributing unit which receives cooling fluid from an inlet and distributes it to the plurality of flow cells. Correspondingly, the outlet manifold is typically a part of the distributing unit which receives cooling fluid from the plurality of flow cells and leads it towards an outlet. The flow cells connect the inlet manifold and the outlet manifold.

In a preferred embodiment the plurality of flow cells may be connected in parallel between the manifolds. This has the advantage that the cooling fluid will flow into all flow cells with substantially the same inlet temperature. This improves temperature uniformity along the surface(s) to be cooled. In a typical application where the surface(s) to be cooled is/are in thermal contact with power semiconductor circuits, this improves the circuit lifetime. Furthermore the distributor exhibits less flow resistance than known units as fluid only passes one cell on its way through the unit and plural cells are connected in parallel between the inlet and outlet manifolds.

Alternatively, the plurality of flow cells may be connected in series between the manifolds.

The fluid may advantageously be a liquid, such as water or a mixture of ethylene-glycol and water for automotive applications where temperatures below 0° C. may occur. Alternatively, the fluid may be a two-phase cooling fluid, such as R134a which is commonly used in refrigerators and freezers.

Each flow channel may be formed to cause a plurality of changes in the direction of flow of the fluid flowing along the surface(s). This is advantageous because it causes turbulence and changes in the flow pattern of the fluid within the flow cells. Fluid which has been heated by passing closely along the surface(s) to be cooled will be effectively mixed with colder fluid which has not passed along the surface(s) to be cooled. This ensures that the full heat capacity of the fluid is put to use in the cooling process.

The housing may comprise at least one main opening formed to be closed in a substantially fluid tight fashion by a surface to be cooled. In this embodiment the surface(s) to be cooled and the housing may in combination form a substantially fluid tight compartment in which the cooling fluid is contained, when the main opening(s) is/are closed by the surface(s) to be cooled.

The housing may comprise at least two main openings as described above. In this case the housing and each of the surfaces to be cooled may form a substantially fluid tight compartment. Alternatively, only the combination of the housing and two or more of the surfaces, e.g. all of the surfaces, may form a substantially fluid tight compartment. In this embodiment it is possible to position the distributing unit adjacent two or more surfaces to be cooled. Thereby the distributing unit may be used for cooling two or more surfaces simultaneously. Furthermore, one or more of the surfaces may function as a radiator, i.e. it/they may be adapted to lead heat originating from one or more surfaces being cooled away from the distributing unit. In a very simple example the housing comprises two main openings. It is then possible to position a surface to be cooled at one main opening and a surface functioning as a radiator at the other main opening. Thereby there is provided a distributing unit which removes heat from the surface to be cooled by means of the cooling fluid, transfers this heat to the other surface which subsequently leads the heat away from the distribution unit. It should be understood that a similar distributing unit may be made with two or more surfaces to be cooled and/or two or more surfaces functioning as radiators.

In case the housing comprises at least two main openings as described above, at least two of the main openings may be arranged in the same plane or in substantially parallel planes. Thus, the openings may be positioned side by side in substantially the same plane, or they may be positioned in substantially parallel planes, e.g. arranged in such a way that they face each other.

In case there are two main openings these may be arranged in substantially parallel planes opposite each other with the inner wall structure arranged in between. Thus, the two surfaces may be positioned, each on one side of the distributing unit, and each being adjacent the manifolds and the flow cells. This ensures that both surfaces will be in thermal contact with the cooling fluid during cooling, thereby providing efficient cooling for both surfaces.

In another embodiment the housing may comprise at least three main openings being arranged relatively to each other in such a way that a cavity is formed between them, the inner wall structure being arranged within said cavity. Thus, in case of three main openings these may outline the shape of a triangle, in case of four main openings they may outline the shape of a square, etc. This ensures that all three or more surfaces will be in thermal contact with the cooling fluid during cooling, thereby providing efficient cooling for all surfaces as explained above.

The housing may comprise an inlet opening for leading fluid to an inner part of the housing and an outlet opening for leading fluid out from the inner part of the housing, the inlet opening being in fluid communication with the inlet manifold, and the outlet opening being in fluid communication with the outlet manifold. The inlet opening is preferably in fluid communication with a source of cooling fluid, and the outlet opening is preferably in fluid communication with a reservoir for collecting cooling fluid leaving the distributor. The inlet as well as the outlet may form part of a recirculation system for the cooling fluid. In this case the outlet opening is also connected to the source of cooling fluid via a heat emitter which ensures that the recirculated cooling fluid obtains a desired lower temperature before it is again led to the inlet opening.

The inlet opening and the outlet opening may be formed on an outer surface of the housing. In this case the housing may comprise a substantially plane surface having the inlet opening and the outlet opening formed therein, and having the inner wall structure formed on one side thereof. This is very advantageous because it provides a very simple structure of the distributing unit which is very suitable for mass production.

The inner wall structure may delimit at least one inner flow cell for distributing fluid over a central part of the surface(s) to be cooled and at least one outer flow cell for distributing fluid over a peripheral part of the surface(s) to be cooled. In this embodiment the flow cells are positioned relatively to each other in such a way that some flow cells are used for cooling only central parts of the surface(s) to be cooled, and some flow cells are used for cooling only peripheral parts of the surface(s). This is an advantage because the cooling performance of each flow in this case can be tailored to meet specific needs by adjusting the channel geometry locally. Thus, the cooling can be focused in positions or areas where it is especially needed, e.g. at hot spots in the heat generating device. Furthermore, temperature gradients across the surface(s) may also be controlled as desired. They may, e.g., be eliminated or considerably reduced, or they may be increased when this is desired.

The inner wall structure may delimit a meandering flow path along the surface(s) in each flow cell. This ensures that the cooling fluid is forced to change direction a number of times when it passes along a surface to be cooled, thereby ensuring that the full heat capacity of the fluid is put to use in the cooling process as explained above.

The distributor of the present invention may advantageously form part of a fluid-coolable unit for removing heat from a heat source. The fluid-coolable unit thus preferably comprises a plate heated by the heat source and a distributor according to the invention for distributing a flow of cooling fluid over a surface of the plate.

The unit may comprise two plates, each being heated by a heat source, in which case the distributor may be adapted to distribute a flow of cooling fluid over a surface of each of the plates.

The fluid-coolable unit described above may advantageously be used for removing heat from an electronic circuit, such as a high power module in a frequency converter or motor drive, or a central processing unit (CPU). In case of a large power module it is important to eliminate, or at least considerably reduce, temperature gradients across the module. Especially if several individual power semiconductors are operated in parallel it is crucial to maintain substantially the same temperature for all components in order to reduce or eliminate the risk of thermal runaway.

The present invention also relates to a fluid-coolable electronic unit, the unit comprising an electronic circuit encapsulated in a circuit module having an outer surface, and a distributor as described above for distributing a flow of cooling fluid over the surface.

BRIEF DESCRIPTION OF THE DRAWINGS

The invention will now be described in further details with reference to the accompanying drawings in which.

DETAILED DESCRIPTION OF THE INVENTION

Figure 1:
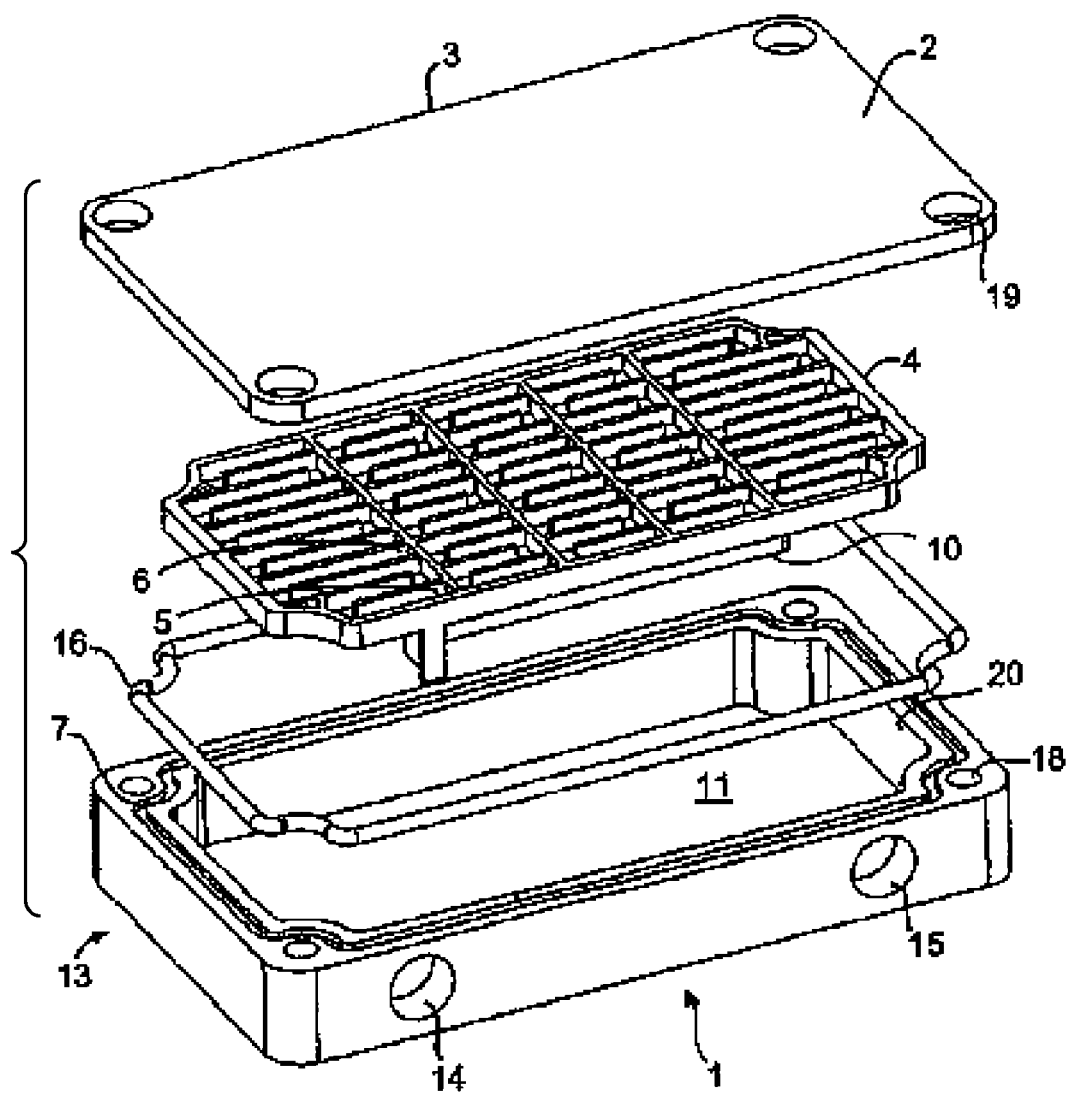
FIG. 1 shows an exploded view of a cooling unit.

Turning now to FIG. 1, a cooling unit 1 includes a housing 13, formed as a box with a flat back plate 11 and side walls 20 which extend from the back towards a main opening at the front of the box. The housing 13 has an inlet opening 15 and an outlet opening 14 for liquid connections from a pipe system or the like.

A baffle 4 fits with the internal surfaces of the side walls 20 of the housing 13. When the baffle 4 is placed in the housing 13, it divides this into a top compartment and a bottom compartment. The bottom compartment is formed between the back plate 11 and the baffle 4, and is further divided into two chambers or manifolds, as will be described later. The openings 14 and 15 are in fluid communication with the bottom compartments.

A top plate 3, the lower surface of which is to be cooled, closes the top compartment when it is mounted on the main opening on the housing 13, by the intermediate of a sealing ring 16. This sealing ring 16 fits into a groove 17 of the housing 13, and seals between the side walls 20 and the top plate 3. The top plate 3 is fixed to the housing 13 by means of screws (not shown in the drawing), which are screwed into holes 18 of the housing 13 through holes 19 in the top plate 3. The top plate 3 will be referred to as the cooled plate, since this plate is cooled by fluid led through the cooling unit. If the cooling unit is employed to cool power semiconductor circuits, the circuits may be arranged on top of the cooled plate 3 in a manner that will be obvious to those skilled in the art. Of course the cooling unit may be employed to cool various other sources of heat such as a hot gas or liquid flowing along the exposed surface of the cooled plate 3.

Figure 2:
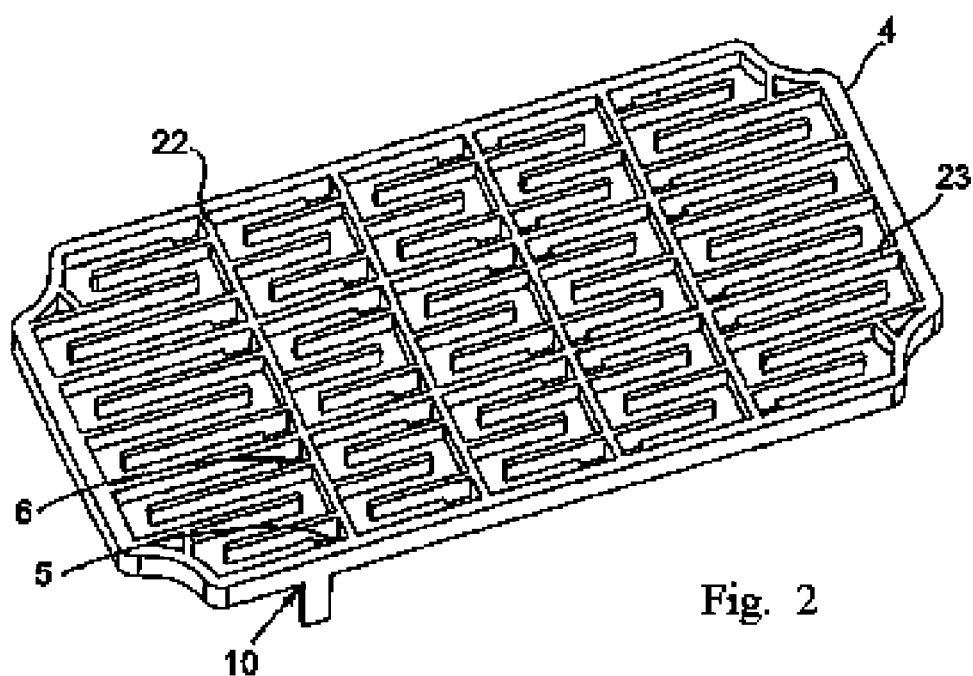
FIG. 2 shows a perspective top view of a flow distributing baffle.
Figure 3:
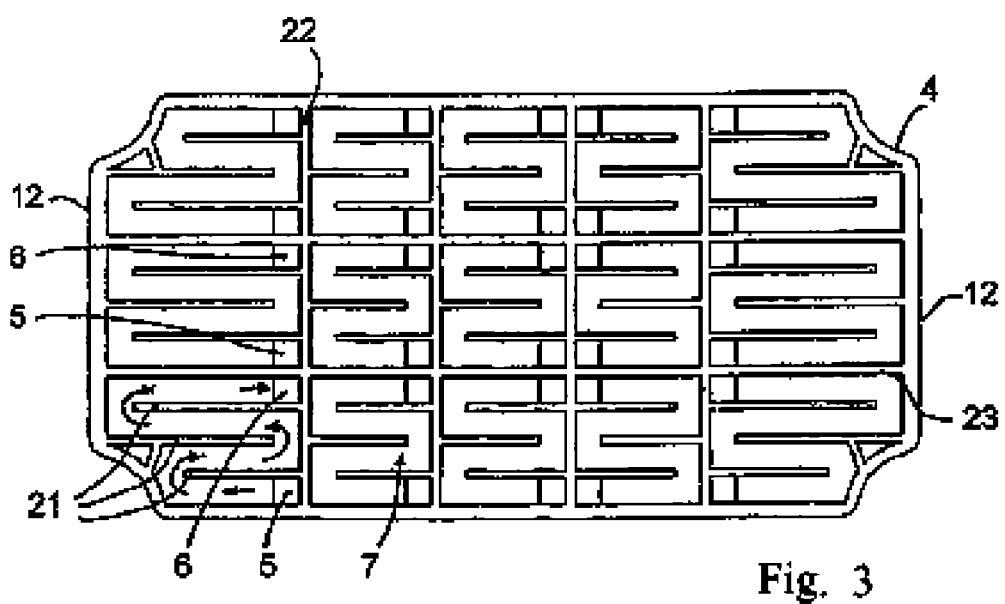
FIG. 3 shows a top view of the distributing baffle.

FIG. 2 shows the baffle 4, in a perspective view slightly more angled than in FIG. 1. Visible in this view are inlets 5 and outlets 6, the location of which was indicated in FIG. 1 by the same reference numeral. The top view of the baffle 4 in FIG. 3 shows the inlets 5 and outlets 6 even more clearly. Fluid flows from the bottom compartment to the top compartment through the inlets 5. While in the top compartment, the flow of fluid is directed along the cooled surface (the bottom surface) of the top plate 3 by guiding wall sections 21 which extend upwards from the center plane of the baffle 4, as indicated by arrows in FIG. 3. The flow then returns from the top compartment to the bottom compartment through the outlets 6.

As will be easily seen in FIG. 3, the guiding wall sections 21 leave a meandering flow path for the fluid, by means of an open passage at one end of each wall section. Other wall sections, however, run all the way through the structure, like wall sections 22 and 23. These through-going walls divide the top compartment into cells, each with an inlet 5 and an outlet 6.

Figure 4:
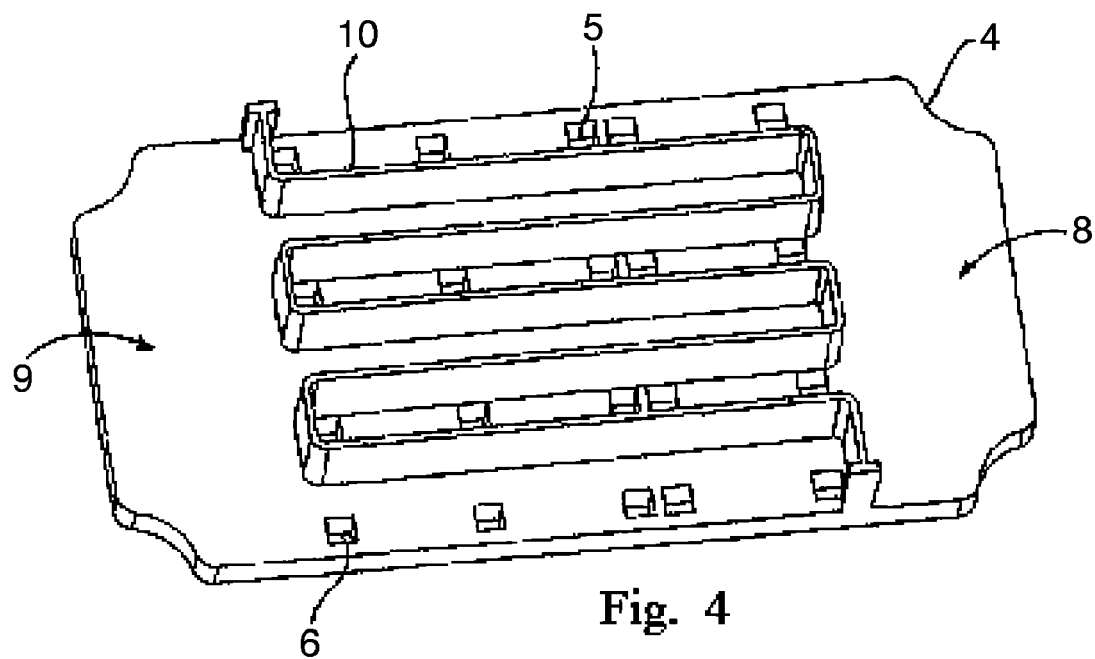
FIG. 4 shows a perspective bottom view of the distributing baffle.
Figure 5:
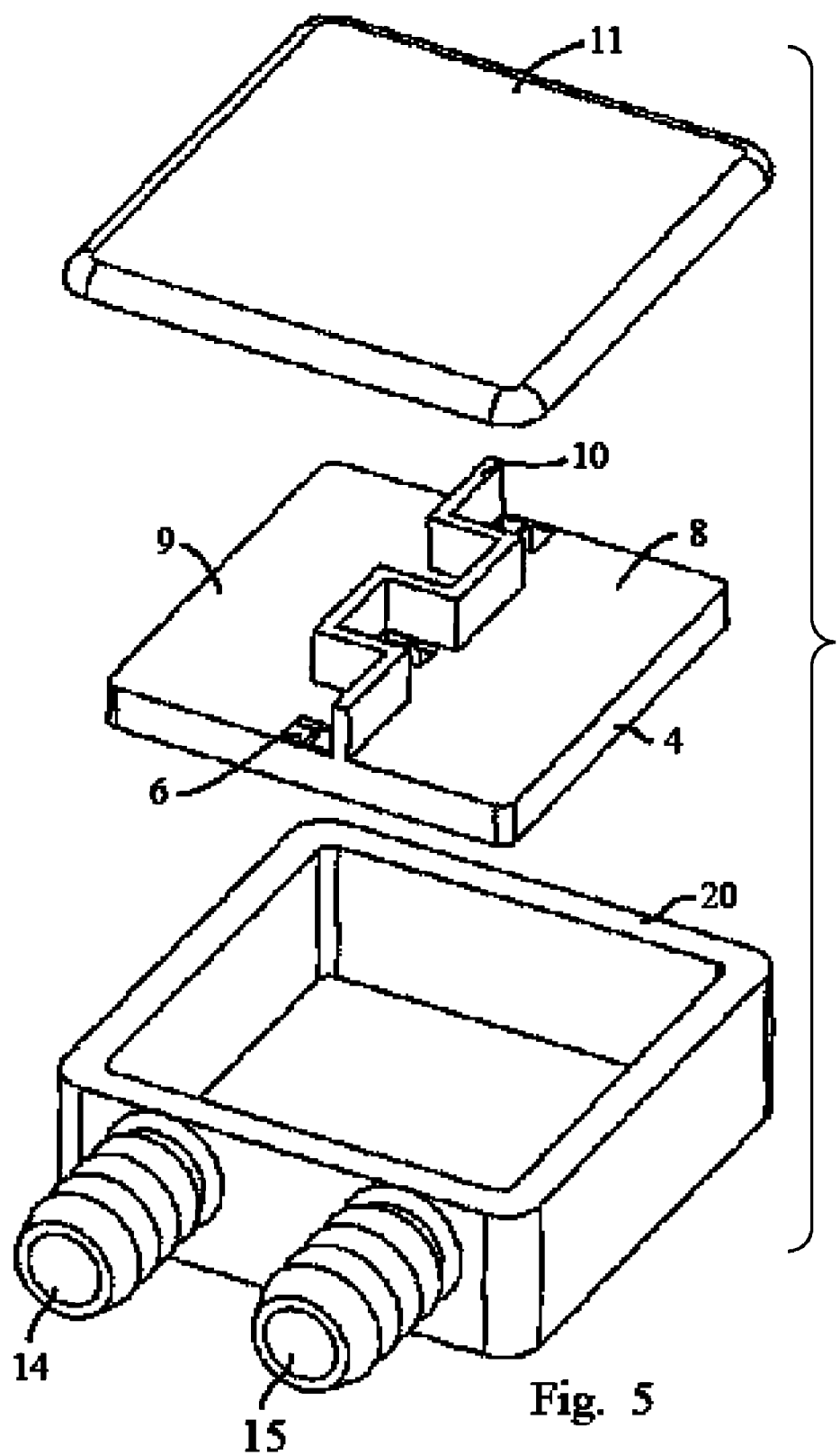
FIG. 5 shows an exploded top view of a clamp-on cooling unit.
Figure 6:
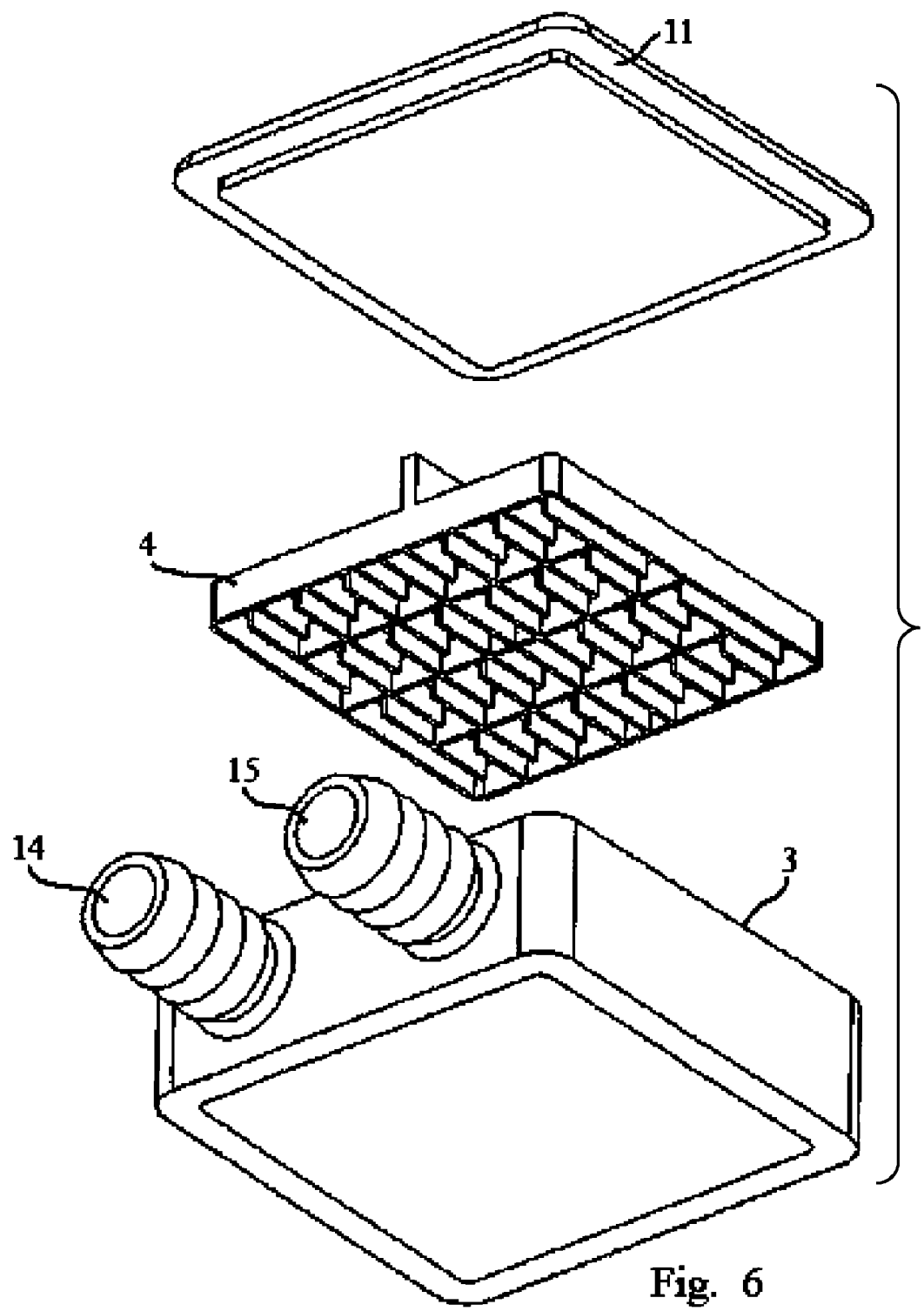
FIG. 6 shows an exploded bottom view of a clamp-on cooling unit.
Figure 7:
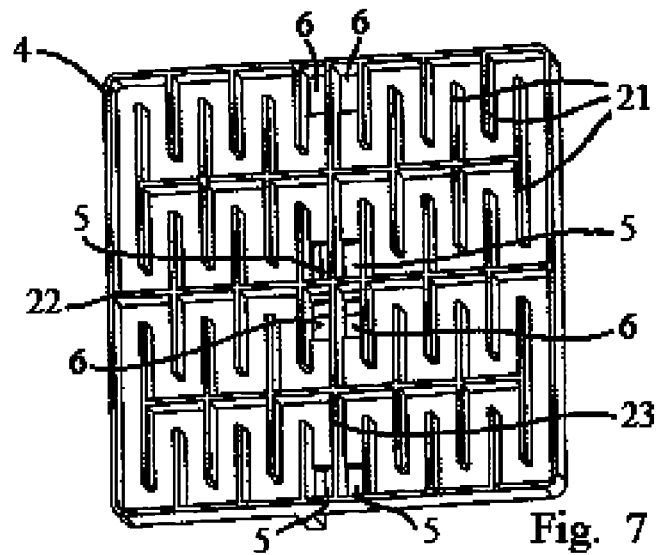
FIG. 7 shows a perspective bottom view of a flow distributing baffle in the clamp-on cooling unit.
Figure 8:
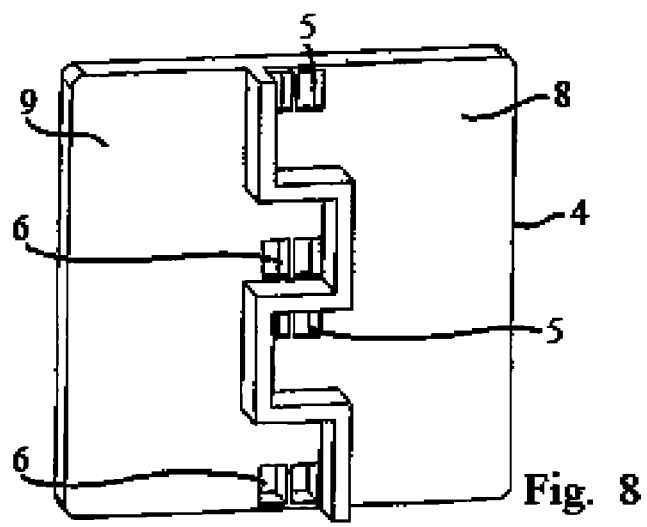
FIG. 8 shows a perspective top view of the distributing baffle in the clamp-on cooling unit.

As mentioned previously, the bottom compartment is divided into two chambers or manifolds. FIG. 4 shows a perspective view of the baffle 4 from the bottom side. A wall section 10, running in a snake-like pattern along the bottom side, will bear on the bottom plate 11 of the housing 13 in substantially fluid-proof abutment. The bottom compartment of the baffle 4 is hereby divided into an inlet compartment or manifold 8 and an outlet compartment or manifold 9, when the baffle 4 is placed in the housing. All cell inlets 5 are in connection with the inlet manifold 8, and all cell outlets 6 are in connection with the outlet manifold 9. The cells of the top compartment, FIGS. 2 and 3, are thus all connected in parallel between the inlet manifold 8 and the outlet manifold 9, and thus in parallel between inlet and outlet positions 15 and 14 of FIG. 1.

The inlets 5 and the outlets 6 are placed such that the outlet of one cell is next to an inlet of another cell. This has the effect that heated liquid, which is about to leave one cell, is close to unheated liquid which has just entered a neighbouring cell. This serves to minimize the heat gradient along the cooled plate 3. The heat gradient along the cooled plate is further minimized by varying the size of the area which the cells cover. Along the edges 12 the area of each cell is larger than on the rest of the surface, whereby the cooling in the area along the edges 12 is less effective than on the rest of the area. This reflects a situation where the density of heat generating elements is lower along the edges of a semiconductor device than on the rest of the device. Lowering the cooling effect along the edges of the cooling unit will improve temperature uniformity across the cooled plate.

In the cooling unit shown in FIGS. 1 to 4, it is intended that a substrate with semiconductors be placed on top of the cooled plate 3, in a way known to those skilled in the art. The cooled plate could however be the substrate itself, placed directly as a cover on the cooling unit. This is a consequence of the minimized heat gradient along the cooled plate, which makes the traditional heat spreading plate, shown in FIG. 1 as the cooled plate 3, superfluous in some applications.

FIGS. 5 to 8 show several views of a similar cooling unit with dimensions adapted for cooling a microprocessor, a video display processor or a similar high-density processing chip in a personal computer, a server computer or the like. The unit is intended to be clamped on top of the circuit to be cooled. Elements corresponding to elements shown in FIGS. 1 to 4 are marked with the same reference numerals. It should be noted that in FIGS. 5 to 8 the back plate 11 is shown detached from the unit whereas in FIGS. 1 to 4 the cooled plate 3 is shown detached from the unit.

Figure 9:
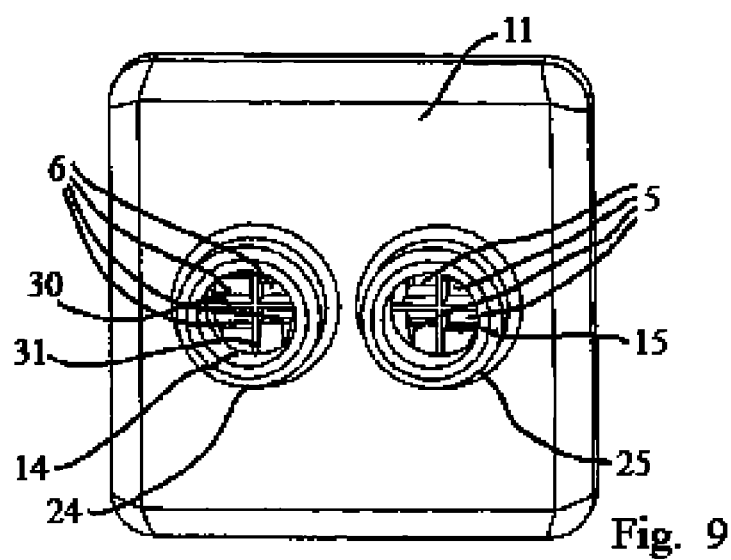
FIG. 9 shows an exploded view of a one-piece flow distributor for cooling purposes, shown in front of a plate to be cooled.
Figure 10:
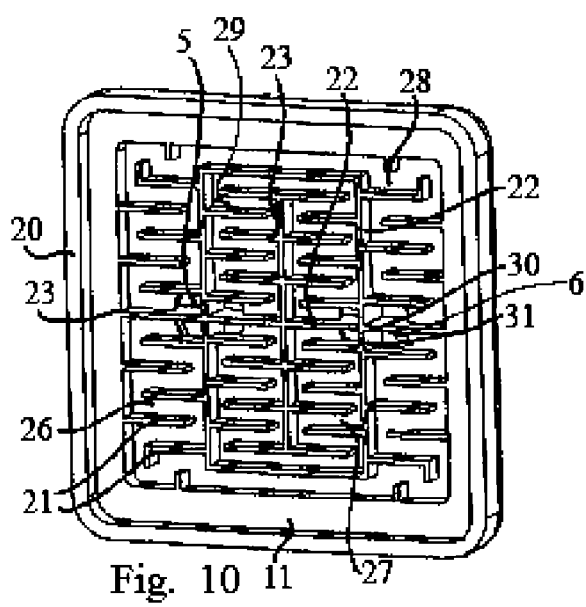
FIG. 10 shows a perspective back view of the one-piece flow distributor.

FIG. 9 shows an exploded view of a one-piece flow distributor 13 for cooling applications in front of a plate 3 to be cooled. FIG. 10 shows the back side of the flow distributor.

The unit shown in FIGS. 9 and 10 is adapted for manufacturing by die casting or injection moulding. It is made in one single piece without the separate baffle of FIGS. 1 to 8.

In FIG. 10, a side wall 20 at the periphery of the back plate 11 extends from the front side of the back plate 11 towards the main opening of the flow distributor, which in use is closed by the plate to be cooled as shown in FIG. 9. Furthermore the front side of the back plate 11 carries an inner wall structure. The inner wall structure is made out of a number of first wall segments 22 and 23 which delimit four flow cells 26, 27, 28 and 29. Second wall segments 21 define a meandering flow path in each flow cell.

On its back side, the back plate 11 is formed with an inlet tube 25 which leads to an inlet opening 15, and with an outlet tube 24 which leads to an outlet opening 14. The bore of both tubes is traversed by portions 30 and 31 of the first wall segments 22 and 23 which run at right angles to each other. This creates four cell inlets 5 at the inner end of the inlet tube 25, and four cell outlets 6 at the inner end of the outlet tube 24. Each cell inlet 5 admits fluid to one of the flow cells 26 through 29 from the inlet tube 25, and each cell outlet passes fluid from one of the flow cells 26 through 29 to the outlet tube 24. In other words, the short inlet and outlet tubes cooperate with the traversing portions of the inner wall structure to act as very low volume inlet and outlet manifolds.

The configuration of the inner wall structure is such that there are two flow cells 27 and 29 which cool the center area of the cooled plate, and two flow cells 26 and 28 which cool the periphery of the cooled plate. In the central flow cells 27, 29 the meandering flow path is narrower, and the meandering frequency is higher than in the peripheral flow cells 26, 28. Channel size and meandering frequency influences the cooling efficiency, and the configuration shown is chosen to adapt the cooling efficiency to the flow of heat expected at the center and at the periphery of the cooled plate.

The overall design of the flow distributing unit of FIGS. 9 and 10 is such that it may be manufactured as a single unit, thus dispensing with the use of a separate baffle.

Figure 11:
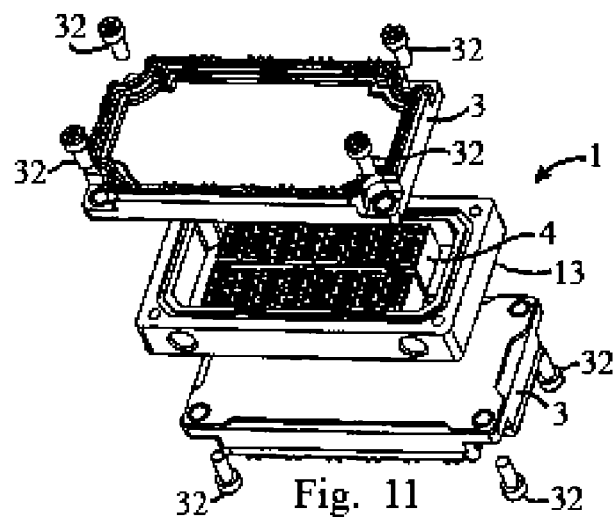
FIG. 11 shows an exploded view of a one-piece flow distributor having two cooling plates.

FIG. 11 shows an exploded view of a cooling unit 1 having a housing 13 with a baffle 4 forming an integrated part thereof. The cooling unit 1 is adapted to have two top plates 3 fixed to the housing 13 by means of screws 32. Thus, when the top plates 3 are fixed to the cooling unit 1, the cooling unit 1 is capable of providing cooling for both top plates 3 simultaneously. Thereby the cooling capacity of the cooling unit 1 may be used in a more efficient manner than is the case for a cooling unit 1 onto which only one top plate 3 may be fitted. Apart from having two top plates 3 the cooling unit 1 of FIG. 11 functions as described above.

Figure 12:
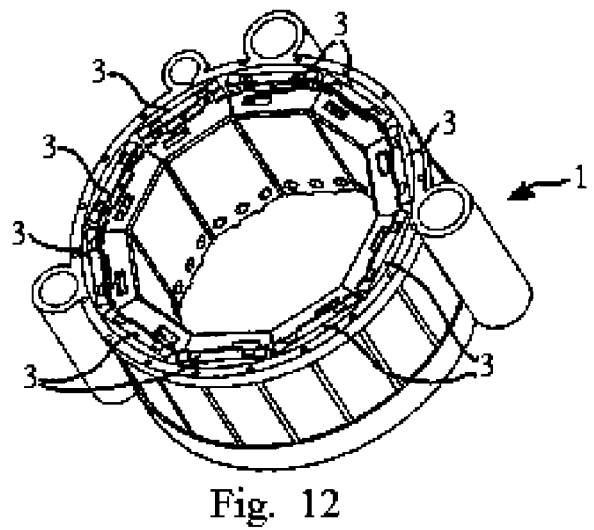
FIG. 12 shows a flow distributor having a circular shape and having ten plates to be cooled arranged on an inner periphery.

FIG. 12 shows a cooling unit 1 having a circular shape. The cooling unit 1 is adapted to have up to ten surfaces to be cooled 3 arranged along an inner periphery of the cooling unit 1. Thus, the cooling unit 1 of FIG. 12 may be used for providing cooling for up to ten surfaces 3 simultaneously. Thereby the cooling capacity of the cooling unit 1 may be used even more efficiently.

Figure 13:
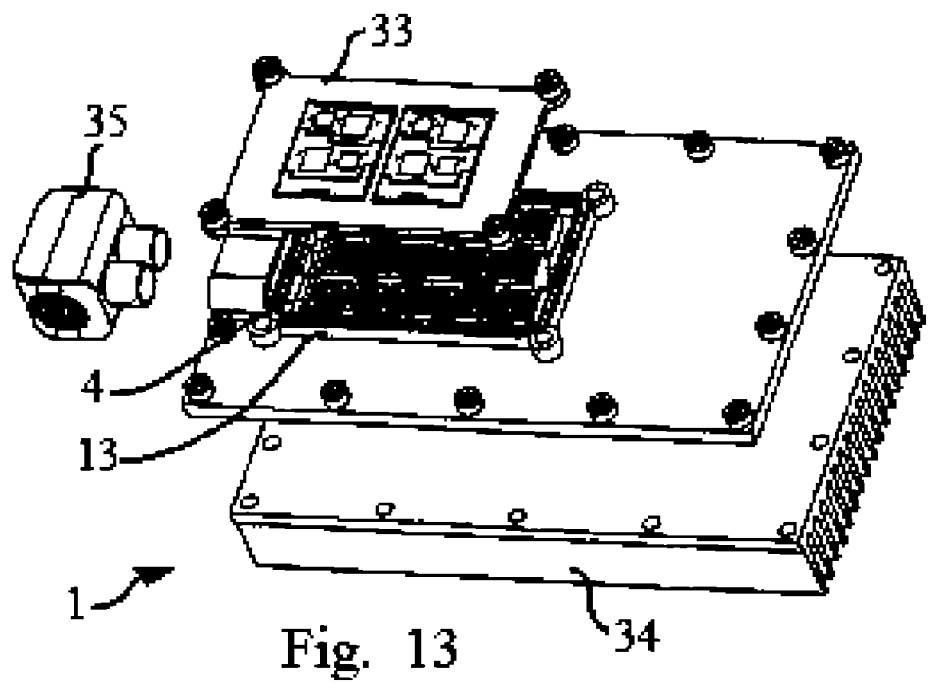
FIGS. 13 and 14 show exploded views of a flow distributor having a cooling plate and a radiator arranged thereon.
Figure 14:
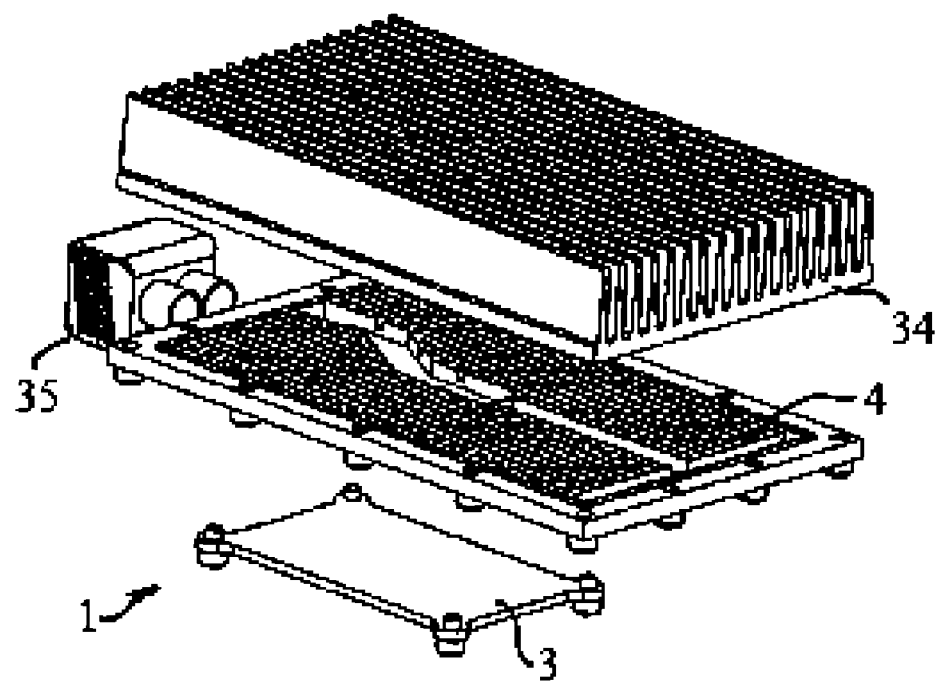

FIGS. 13 and 14 show exploded views, seen from opposite directions, of a cooling unit 1 having a housing 13 with a baffle 4 forming an integrated part thereof. The cooling unit 1 is adapted to have an integrated circuit 33 fixed at one side of the housing 13, the integrated circuit 33 having a surface 3 which needs cooling, and a radiator part 34 fixed at another, oppositely positioned side of the housing 13. It further comprises a pump unit 35 for providing the cooling fluid to the cooling unit 1 and for receiving the cooling fluid from the cooling unit 1 after it has passed through the flow cells. Additionally a reservoir may be provided. The pump unit 35 is shown as a separate part in FIGS. 13 and 14. Alternatively the pump unit, or at least a housing part of it, could be manufactured as an integrated part of the housing 13, thereby even further reducing the number of necessary processing steps when manufacturing the cooling unit 1.

The cooling unit 1 of FIGS. 13 and 14 preferably functions in the following way. When the integrated circuit 33 is running it produces heat, thereby heating surface 3. Surface 3 is cooled by the cooling unit 1 as described above. During this process heat is transferred from the surface 3 to the cooling fluid. The cooling fluid is also in contact with the radiator part 34, and the heat which has been transferred from the surface 3 to the cooling fluid is therefore subsequently transferred to the radiator part 34. The radiator part 34 is adapted to lead the received heat away from the cooling unit 1. This is very advantageous because the cooling of the integrated circuit 33 is more efficient than when using cooling units 1 without a radiator part 34 fixed thereto. This is due to the fact that the radiator part 34 keeps the temperature of the cooling fluid relatively low, thereby allowing the cooling fluid to cool the surface 3 more efficiently.

While the present invention has been illustrated and described with respect to a particular embodiment thereof, it should be appreciated by those of ordinary skill in the art that various modifications to this invention may be made without departing from the spirit and scope of the present invention.

The invention claimed is:

1. A distributor for distributing a flow of fluid over at least one surface to be cooled, the distributor comprising a housing being manufactured in a single piece and having formed therein an inlet manifold, an outlet manifold and a plurality of flow cells connected between the manifolds, each flow cell comprising a cell inlet in fluid communication with the inlet manifold, a cell outlet in fluid communication with the outlet manifold, and a flow channel for guiding a flow of fluid from the cell inlet along the at least one surface to the cell outlet, wherein an inner wall structure of the housing defines the inlet manifold, the outlet manifold and the plurality of flow cells, and wherein the plurality of flow cells are arranged in parallel in two directions between the manifolds.

2. The distributor according to claim 1, wherein each flow channel is formed to cause a plurality of changes in the direction of flow of the fluid flowing along the at least one surface to be cooled.

3. The distributor according to claim 1, wherein the housing comprises at least one main opening formed to be closed in a substantially fluid tight fashion by a surface to be cooled.

4. The distributor according to claim 3, wherein the housing comprises at least two main openings, each being formed to be closed in a substantially fluid tight fashion by a surface to be cooled.

5. The distributor according to claim 4, wherein at least two of the main openings are arranged in the same plane or in substantially parallel planes.

6. The distributor according to claim 4, wherein the housing comprises two main openings being arranged in substantially parallel planes opposite each other with the inner wall structure arranged in between.

7. The distributor according to claim 4, wherein the housing comprises at least three main openings being arranged relatively to each other in such a way that a cavity is formed between them, the inner wall structure being arranged within said cavity.

8. The distributor according to claim 1, wherein the housing comprises an inlet opening for leading fluid to an inner part of the housing and an outlet opening for leading fluid out from the inner part of the housing, the inlet opening being in fluid communication with the inlet manifold, and the outlet opening being in fluid communication with the outlet manifold.

9. The distributor according to claim 8, wherein the inlet opening and the outlet opening are formed on an outer surface of the housing.

10. The distributor according to claim 9, wherein the housing comprises a substantially plane surface having the inlet opening and the outlet opening formed therein, and having the inner wall structure formed on one side thereof.

11. The distributor according to claim 1, wherein the inner wall structure delimits at least one inner flow cell for distributing fluid over a central part of the at least one surface and at least one outer flow cell for distributing fluid over a peripheral part of the surface(s) to be cooled.

12. The distributor according to claim 1, wherein the inner wall structure delimits a meandering flow path along the at least one surface in each flow cell.

13. A fluid-coolable unit for removing heat from a heat source, the unit comprising:

a plate heated by the heat source; and a distributor for distributing a flow of cooling fluid over a surface of the plate, the distributor comprising a housing being manufactured in a single piece and having formed therein an inlet manifold, an outlet manifold and a plurality of flow cells connected between the manifolds, wherein each flow cell comprises a cell inlet in fluid communication with the inlet manifold, a cell outlet in fluid communication with the outlet manifold, and a flow channel for guiding the flow of cooling fluid from the cell inlet along the at least one surface to the cell outlet, wherein an inner wall structure of the housing defines the inlet manifold, the outlet manifold and the plurality of flow cells, and wherein the plurality of flow cells are arranged in parallel in two directions between the manifolds.

14. The fluid-coolable unit according to claim 13, wherein the unit comprises two plates, each being heated by a heat source, and wherein the distributor is adapted to distribute a flow of cooling fluid over a surface of each of the plates.

15. A method for removing heat from an electronic circuit, the method comprising:

providing a fluid-coolable unit for removing heat from a heat source, the unit comprising a plate heated by the heat source; and a distributor for distributing a flow of cooling fluid over a surface of the plate, the distributor comprising a housing being manufactured in a single piece and having formed therein an inlet manifold, an outlet manifold and a plurality of flow cells connected between the manifolds, wherein each flow cell comprises a cell inlet in fluid communication with the inlet manifold, a cell outlet in fluid communication with the outlet manifold, and a flow channel for guiding the flow of cooling fluid from the cell inlet along the at least one surface to the cell outlet, wherein an inner wall structure of the housing defines the inlet manifold, the outlet manifold and the plurality of flow cells, and wherein the plurality of flow cells are arranged in parallel in two directions between the manifolds;

joining the unit to the electronic circuit; and initiating the flow of cooling fluid, wherein the surface of the plate is adjacent to the electronic circuit.

16. A fluid-coolable electronic unit, the unit comprising an electronic circuit encapsulated in a circuit module having an outer surface, and a distributor for distributing a flow of cooling fluid over the surface, the distributor comprising a housing being manufactured in a single piece and having formed therein an inlet manifold, an outlet manifold and a plurality of flow cells connected between the manifolds, wherein each flow cell comprises a cell inlet in fluid communication with the inlet manifold, a cell outlet in fluid communication with the outlet manifold, and a flow channel for guiding the flow of cooling fluid from the cell inlet along the at least one surface to the cell outlet, wherein an inner wall structure of the housing defines the inlet manifold, the outlet manifold and the plurality of flow cells, and wherein the plurality of flow cells are arranged in parallel in two directions between the manifolds.

* * * * *